US011609617B2

(12) United States Patent
Xiao et al.

(10) Patent No.: US 11,609,617 B2
(45) Date of Patent: Mar. 21, 2023

(54) MODULAR FORM FACTOR OF A PRINTED CIRCUIT BOARD FOR AN INFORMATION HANDLING SYSTEM

(71) Applicant: Dell Products L.P., Round Rock, TX (US)

(72) Inventors: Yimin Xiao, Austin, TX (US); Jake Hill Lavallo, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 221 days.

(21) Appl. No.: 16/797,256

(22) Filed: Feb. 21, 2020

(65) Prior Publication Data

US 2021/0263569 A1 Aug. 26, 2021

(51) Int. Cl.
*G06F 1/18* (2006.01)
*H05K 1/02* (2006.01)
*G06T 1/20* (2006.01)
*G09G 3/30* (2006.01)

(52) U.S. Cl.
CPC .............. *G06F 1/181* (2013.01); *G06F 1/185* (2013.01); *G06T 1/20* (2013.01); *H05K 1/02* (2013.01); *G09G 3/30* (2013.01); *G09G 2360/06* (2013.01)

(58) Field of Classification Search
CPC ....................................................... G06F 13/04
See application file for complete search history.

(56) References Cited

U.S. PATENT DOCUMENTS

| 5,911,049 A | * | 6/1999 | Watanabe | G06F 3/1236 710/100 |
| 6,731,515 B2 | * | 5/2004 | Rhoads | H05K 7/1444 361/796 |
| 9,818,456 B1 | * | 11/2017 | Wu | H05K 7/1427 |
| 10,729,030 B1 | * | 7/2020 | Cousineau | H05K 3/3405 |

OTHER PUBLICATIONS

Shilov, Anton. "Innodisk Launches M.2 Graphics Card with 4K Output." *RSS*, AnandTech, Dec. 5, 2018, www.anandtech.com/show/13677/innodisk-launches-m2-graphics-card-with-4k-outpu; 5 pages.

* cited by examiner

*Primary Examiner* — Jerry Wu
(74) *Attorney, Agent, or Firm* — McDermott Will & Emery LLP

(57) ABSTRACT

An information handling system, including two or more single-slot M.2 modules; a dual-slot discrete graphics processing unit (dGPU) module; a printed circuit board, including: a plurality of M.2 connectors aligned on a same edge of the printed circuit board such that: a first single-slot M.2 module of the two or more single-slot M.2 modules is coupled to a first M.2 connector of the plurality of M.2 connectors; a second single-slot M.2 module of the two or more single-slot M.2 modules is coupled to a second M.2 connector of the plurality of M.2 connectors; and the dual-slot dGPU module is coupled to a third and a fourth M.2 connector of the plurality of M.2 connectors.

6 Claims, 8 Drawing Sheets

MODULAR FORM FACTOR OF A PRINTED CIRCUIT BOARD FOR AN INFORMATION HANDLING SYSTEM

BACKGROUND

Field of the Disclosure

The disclosure relates generally to an information handling system, and in particular, a modular form factor of a printed circuit board for an information handling system.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems traditionally have unique connections for graphics processing cards on a motherboard of the information handling system, thus limiting versatility of the motherboard of the information handling system.

SUMMARY

Innovative aspects of the subject matter described in this specification may be embodied in an information handling system, including two or more single-slot M.2 modules; a dual-slot discrete graphics processing unit (dGPU) module; a printed circuit board, including: a plurality of M.2 connectors aligned on a same edge of the printed circuit board such that: a first single-slot M.2 module of the two or more single-slot M.2 modules is coupled to a first M.2 connector of the plurality of M.2 connectors; a second single-slot M.2 module of the two or more single-slot M.2 modules is coupled to a second M.2 connector of the plurality of M.2 connectors; and the dual-slot dGPU module is coupled to a third and a fourth M.2 connector of the plurality of M.2 connectors.

These and other embodiments may each optionally include one or more of the following features. For instance, the third and the fourth M.2 connector of the plurality of M.2 connectors are adjacent to one another. At least one of the single-slot M.2 modules include a solid-state storage (SSD) module. A pitch between each of the plurality of M.2 connectors is substantially the same.

Innovative aspects of the subject matter described in this specification may be embodied in an information handling system, including two or more single-slot M.2 modules; a dual-slot discrete graphics processing unit (dGPU) module; a printed circuit board, including: a plurality of M.2 connectors aligned on a same edge of the printed circuit board such that one or more combinations of i) the two or more single-slot M.2 modules and/or ii) the dual-slot dGPU module can be coupled to two or more of the plurality of M.2 connectors.

These and other embodiments may each optionally include one or more of the following features. For instance, each of the plurality of M.2 connectors is connected to respective single-slot M.2 module. Further including four single-slot M.2 modules, and wherein the printed circuit board includes at least four M.2 connectors, wherein each of four M.2 connectors are respectively connected to the four single-slot M.2 modules. Two of the plurality of M.2 connectors are connected to respective single-slot M.2 modules of the two or more single-slot M.2 modules, and two other M.2 connectors of the plurality of M.2 connectors are coupled to the dual-slot dGPU module. The two other M.2 connectors are adjacent to one another. Further comprising a quad-slot dGPU module, wherein four of the M.2 connectors of the plurality of M.2 connectors are coupled to the quad-slot dGPU module. At least one of the single-slot M.2 modules include a solid-state storage (SSD) module. A pitch between each of the plurality of M.2 connectors is substantially the same.

Innovative aspects of the subject matter described in this specification may be embodied in a printed circuit board, including: a plurality of M.2 connectors aligned on a same edge of the printed circuit board such that a first M.2 connector of the plurality of M.2 connectors is connected to a first single-slot M.2 module; a second M.2 connector of the plurality of M.2 connectors is connected to a second single-slot M.2 module; and a third and a fourth M.2 connector of the plurality of M.2 connectors is connected to a dual-slot dGPU module.

These and other embodiments may each optionally include one or more of the following features. For instance, the third and the fourth M.2 connector of the plurality of M.2 connectors are adjacent to one another. A pitch between each of the plurality of M.2 connectors is substantially the same.

The details of one or more embodiments of the subject matter described in this specification are set forth in the accompanying drawings and the description below. Other potential features, aspects, and advantages of the subject matter will become apparent from the description, the drawings, and the claims.

DESCRIPTION OF PARTICULAR EMBODIMENT(S)

In the following description, details are set forth by way of example to facilitate discussion of the disclosed subject matter. It should be apparent to a person of ordinary skill in the field, however, that the disclosed embodiments are exemplary and not exhaustive of all possible embodiments.

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a personal computer, a PDA, a consumer electronic device, a network storage device, or another suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include an instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory (SSD); as well as communications media such wires, optical fibers, microwaves, radio waves, and other electromagnetic and/or optical carriers; and/or any combination of the foregoing.

Particular embodiments are best understood by reference to FIGS. 1-8 wherein like numbers are used to indicate like and corresponding parts.

Figure 1:
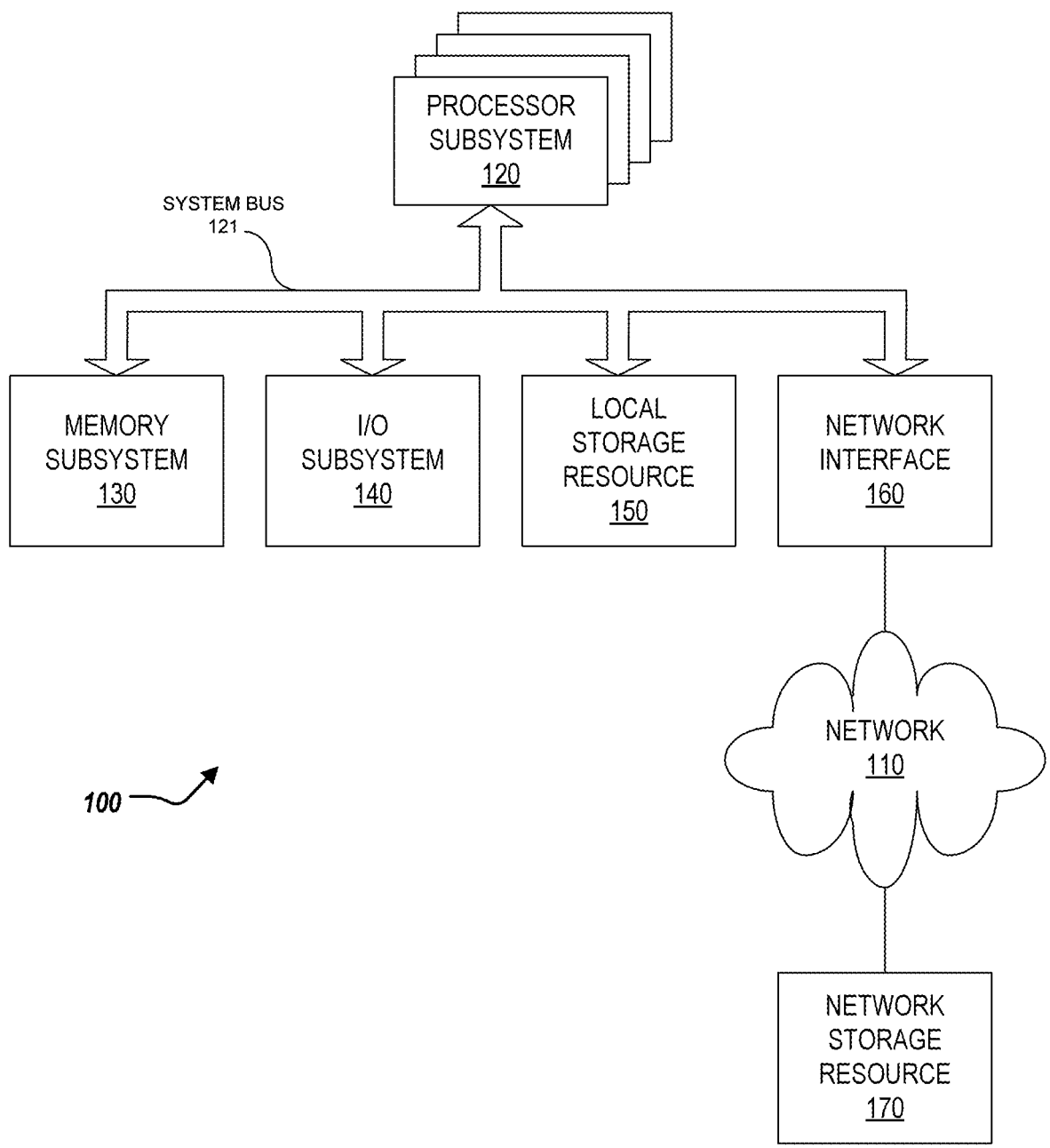
FIG. 1 is a block diagram of selected elements of an embodiment of an information handling system.

Turning now to the drawings, FIG. 1 illustrates a block diagram depicting selected elements of an information handling system 100 in accordance with some embodiments of the present disclosure. In various embodiments, information handling system 100 may represent different types of portable information handling systems, such as, display devices, head mounted displays, head mount display systems, smart phones, tablet computers, notebook computers, media players, digital cameras, 2-in-1 tablet-laptop combination computers, and wireless organizers, or other types of portable information handling systems. In one or more embodiments, information handling system 100 may also represent other types of information handling systems, including desktop computers, server systems, controllers, and microcontroller units, among other types of information handling systems. Components of information handling system 100 may include, but are not limited to, a processor subsystem 120, which may comprise one or more processors, and system bus 121 that communicatively couples various system components to processor subsystem 120 including, for example, a memory subsystem 130, an I/O subsystem 140, a local storage resource 150, and a network interface 160. System bus 121 may represent a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus.

As depicted in FIG. 1, processor subsystem 120 may comprise a system, device, or apparatus operable to interpret and/or execute program instructions and/or process data, and may include a microprocessor, microcontroller, digital signal processor (DSP), application specific integrated circuit (ASIC), or another digital or analog circuitry configured to interpret and/or execute program instructions and/or process data. In some embodiments, processor subsystem 120 may interpret and/or execute program instructions and/or process data stored locally (e.g., in memory subsystem 130 and/or another component of information handling system). In the same or alternative embodiments, processor subsystem 120 may interpret and/or execute program instructions and/or process data stored remotely (e.g., in network storage resource 170).

Also in FIG. 1, memory subsystem 130 may comprise a system, device, or apparatus operable to retain and/or retrieve program instructions and/or data for a period of time (e.g., computer-readable media). Memory subsystem 130 may comprise random access memory (RAM), electrically erasable programmable read-only memory (EEPROM), a PCMCIA card, flash memory, magnetic storage, opto-magnetic storage, and/or a suitable selection and/or array of volatile or non-volatile memory that retains data after power to its associated information handling system, such as system 100, is powered down.

In information handling system 100, I/O subsystem 140 may comprise a system, device, or apparatus generally operable to receive and/or transmit data to/from/within information handling system 100. I/O subsystem 140 may represent, for example, a variety of communication interfaces, graphics interfaces, video interfaces, user input interfaces, and/or peripheral interfaces. In various embodiments, I/O subsystem 140 may be used to support various peripheral devices, such as a touch panel, a display adapter, a keyboard, an accelerometer, a touch pad, a gyroscope, an IR sensor, a microphone, a sensor, or a camera, or another type of peripheral device.

Local storage resource 150 may comprise computer-readable media (e.g., hard disk drive, floppy disk drive, CD-ROM, and/or other type of rotating storage media, flash memory, EEPROM, and/or another type of solid state storage media) and may be generally operable to store instructions and/or data. Likewise, the network storage resource may comprise computer-readable media (e.g., hard disk drive, floppy disk drive, CD-ROM, and/or other type of rotating storage media, flash memory, EEPROM, and/or other type of solid state storage media) and may be generally operable to store instructions and/or data.

In FIG. 1, network interface 160 may be a suitable system, apparatus, or device operable to serve as an interface between information handling system 100 and a network 110. Network interface 160 may enable information handling system 100 to communicate over network 110 using a suitable transmission protocol and/or standard, including, but not limited to, transmission protocols and/or standards enumerated below with respect to the discussion of network 110. In some embodiments, network interface 160 may be communicatively coupled via network 110 to a network storage resource 170. Network 110 may be a public network or a private (e.g. corporate) network. The network may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and/or messages (generally referred to as data). Network interface 160 may enable wired and/or wireless communications (e.g., NFC or Bluetooth) to and/or from information handling system 100.

In particular embodiments, network 110 may include one or more routers for routing data between client information handling systems 100 and server information handling systems 100. A device (e.g., a client information handling system 100 or a server information handling system 100) on network 110 may be addressed by a corresponding network address including, for example, an Internet protocol (IP) address, an Internet name, a Windows Internet name service (WINS) name, a domain name or other system name. In particular embodiments, network 110 may include one or more logical groupings of network devices such as, for example, one or more sites (e.g. customer sites) or subnets. As an example, a corporate network may include potentially thousands of offices or branches, each with its own subnet (or multiple subnets) having many devices. One or more client information handling systems 100 may communicate with one or more server information handling systems 100 via any suitable connection including, for example, a modem connection, a LAN connection including the Ethernet or a broadband WAN connection including DSL, Cable, Ti, T3, Fiber Optics, Wi-Fi, or a mobile network connection including GSM, GPRS, 3G, or WiMax.

Network 110 may transmit data using a desired storage and/or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), and/or any combination thereof. Network 110 and its various components may be implemented using hardware, software, or any combination thereof.

Figure 2:
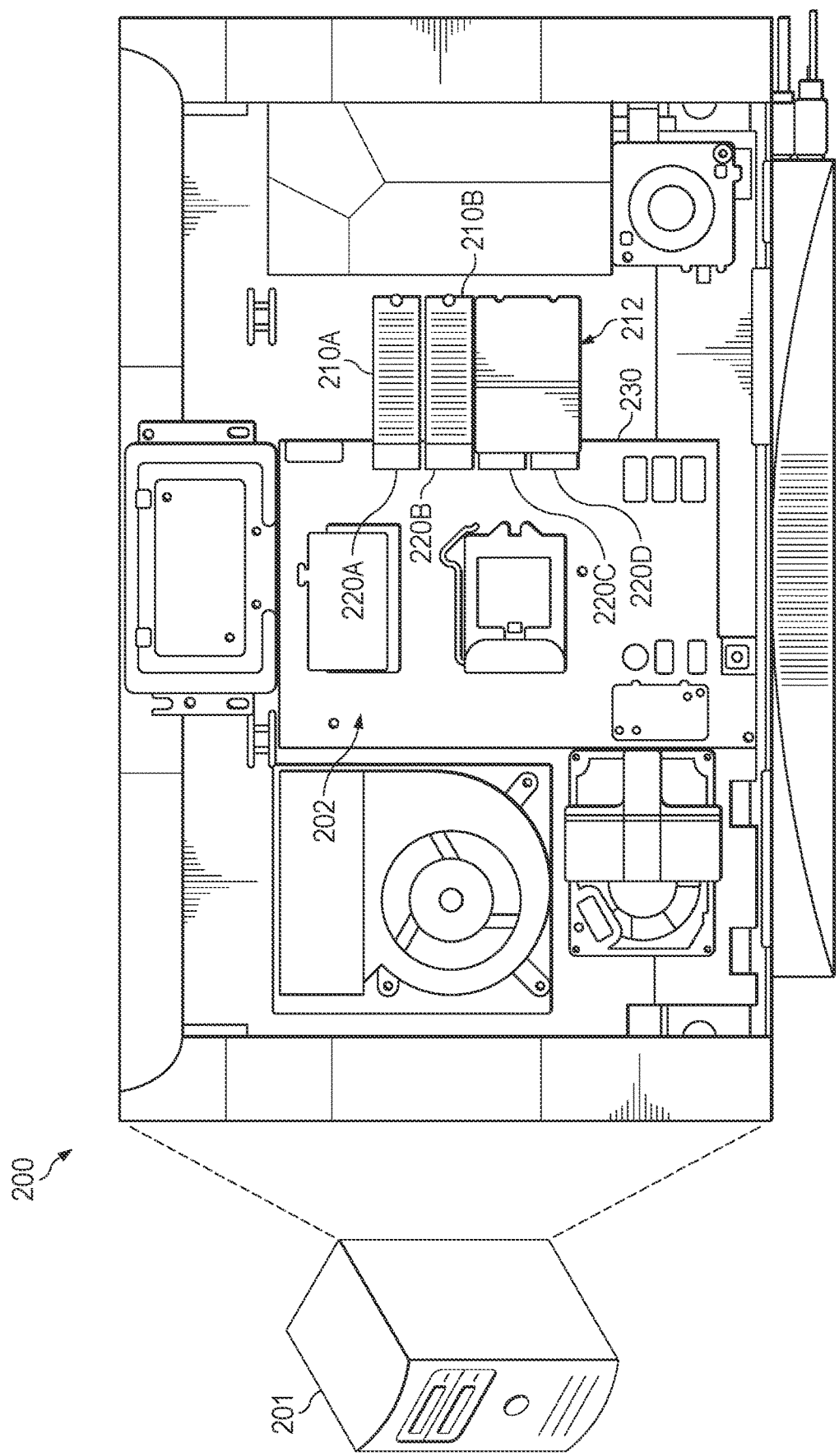
FIGS. 2, 5, 6 illustrates a computing environment including the information handling system and a printed circuit board of the information handling system.

Turning now to FIG. 2, FIG. 2 illustrates a computing environment 200 including an information handling system 201. The information handling system 201 can include at least a printed circuit board 202 (among other computing components). For example, the printed circuit board 202 can be included in one or more subsystems of the information handling system 100, and in particular, included in the processor subsystem 120 of the information handling system 100. In some examples, the printed circuit board 202 is a motherboard. In short, the printed circuit board 202 can interface with a new modular discrete graphics form factor that can leverage multiple (2, 4, or more) M.2 connectors that have a defined pitch between each of the M.2 connectors. The printed circuit board 202 (or motherboard 202) can leverage the M.2 connectors for i) discrete graphics processing unit (dGPU) modules, ii) support storage devices (e.g., industry standard M.2 modules), or both. In some examples, the information handling system 201 can be similar to the information handling system 100 of FIG. 1.

In particular, the information handling system 201 can include the printed circuit board 202; single-slot M.2 modules 210a, 210b (collectively referred to as single-slot M.2 modules 210); and a dual-slot dGPU module 212. The printed circuit board 202 can include four M.2 connectors 220a, 220b, 220c, 220d (collectively referred to as M.2 connectors 220); however, the printed circuit board 202 can include any number of M.2 connectors 220. Each of the M.2 connectors 220 can be aligned to accommodate an appropriate dGPU module, support storage devices, or both, as described further herein. For example, each of the M.2 connectors 220 are aligned in a straight (or substantially straight) line. In some examples, each of the M.2 connectors 220 can be aligned on a same edge 230 (or side 230) of the printed circuit board 202. Other alignments of the M.2 connectors 220 on the printed circuit board 202 are possible to accommodate the appropriate dGPU module, support storage devices, or both; including a vertical alignment of the M.2 connectors 220. The M.2 connectors 220 can be combined to provide an appropriate x8 PCIe or x16 PCIe connection (e.g., a combination of 2 or 4 of the M.2 connectors 220).

Figure 3:
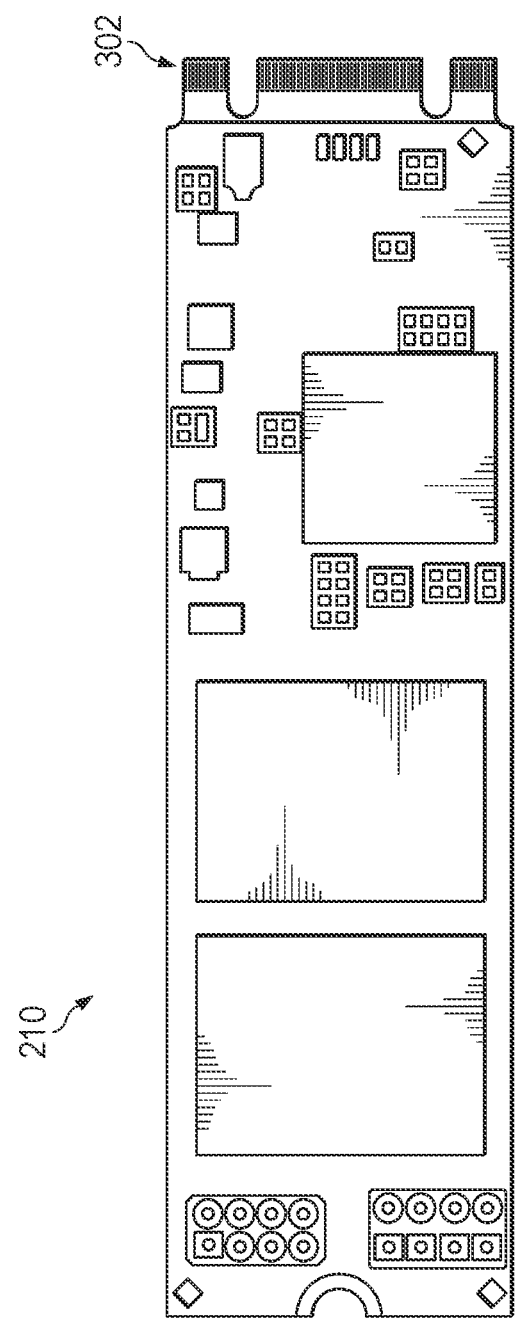
FIG. 3 illustrates a single-slot M.2 module.

FIG. 3 illustrates an example single-slot M.2 module 210. The single-slot M.2 module 210 can include connection tabs 302 that can be inserted into the M.2 connector 220 to establish a coupling/connection with the M.2 connector 220. In some examples, the single-slot M.2 modules 210 can include a solid-state storage (SSD) module.

Figure 4:
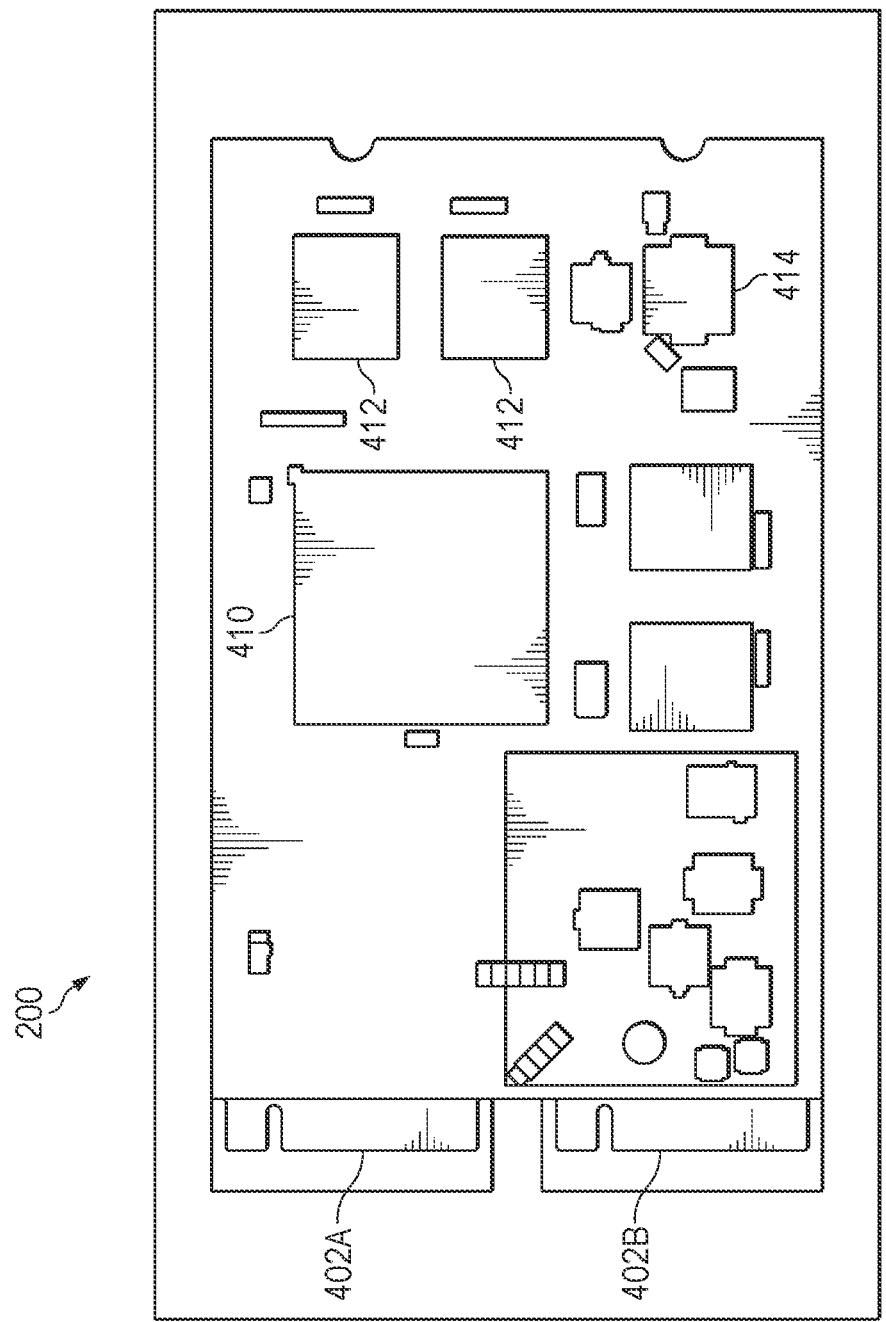
FIG. 4 illustrates a dual-slot dGPU module.

FIG. 4 illustrates an example dual-slot dGPU module 212. The dual-slot dGPU module 212 can include a first and a second set of connections tabs 402a, 402b (collectively referred to as connection tabs 402) that can be inserted into the M.2 connector 220 to establish a coupling/connection with the M.2 connector 220. The dual-slot dGPU module 212 can include an appropriate GPU chipset 410, memory modules 412, voltage regulator 414 (e.g., from 3.3 volts), and appropriate PCIe bus components from the connection tabs 402 (e.g., "gold fingers") to the GPU 410.

To that end, by each of the M.2 connectors 220 being aligned in a straight line, e.g., on the same edge 230 of the printed circuit board 202, the printed circuit board 202 is able to leverage the M.2 connectors 220 for different configurations of the single-slot M.2 modules 210 and dGPU modules (e.g., the dual-slot dGPU module 212 or a quad-slot dGPU module). Specifically, the plurality of M.2 connectors 220 are aligned on the same edge 230 of the printed circuit board 202 such that one or more combinations of i) the single-slot M.2 modules 210 and/or ii) the dual-slot dGPU module 212 can be coupled/connected to respective M.2 connectors 220.

For example, as illustrated in the example of FIG. 2, two of the M.2 connectors 220 are connected to respective single-slot M.2 modules 210, and two other M.2 connectors 220 are coupled to the dual-slot dGPU module 212. Specifically, the M.2 connector 220a is coupled to the single-slot M.2 module 210a; the M.2 connector 220b is coupled to the single-slot M.2 module 210b; and the M.2 connectors 220c, 220d are both coupled to the dual-slot dGPU module 212. The M.2 connectors 220c, 220d are adjacent to one another such that the dual-slot dGPU module 212 can be coupled to the M.2 connectors 220c, 220d. In some examples, the pitch between each of the M.2 connectors 220 is substantially the same (e.g., the distance between each M.2 connector 220 is substantially the same).

Figure 5:
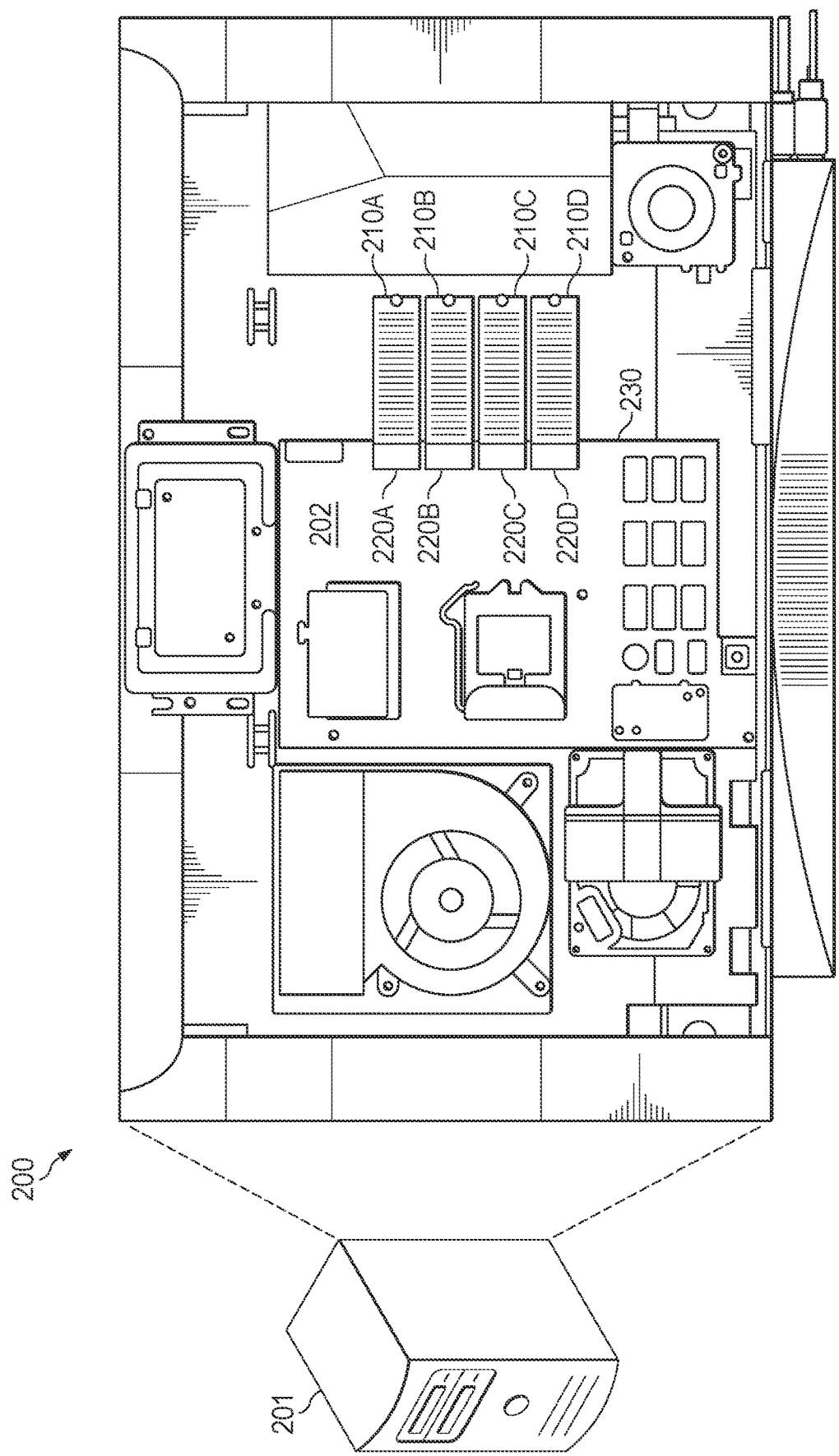

In another example, as illustrated in the example of FIG. 5, each of the M.2 connectors 220 (e.g., four M.2 connectors 220) are connected to respective single-slot M.2 modules 210. Specifically, the M.2 connector 220a is coupled to the single-slot M.2 module 210a; the M.2 connector 220b is coupled to the single-slot M.2 module 210b; the M.2 connector 220c is coupled to the single-slot M.2 module 210c; and the M.2 connector 220d is coupled to the single-slot M.2 module 210d. In some examples, the pitch between each of the M.2 connectors 220 is substantially the same (e.g., the distance between each M.2 connector 220 is substantially the same).

Figure 6:
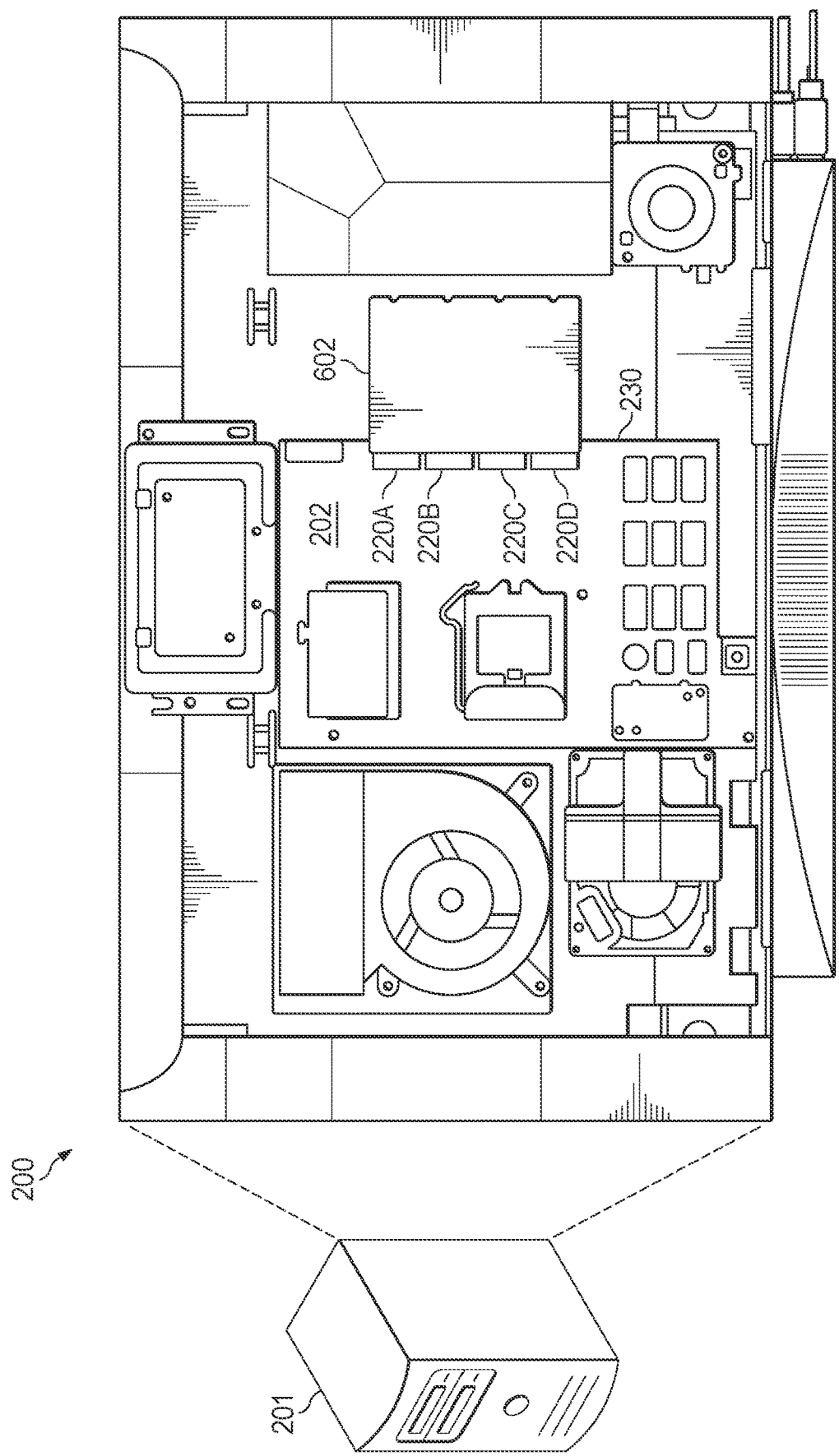
Figure 7:
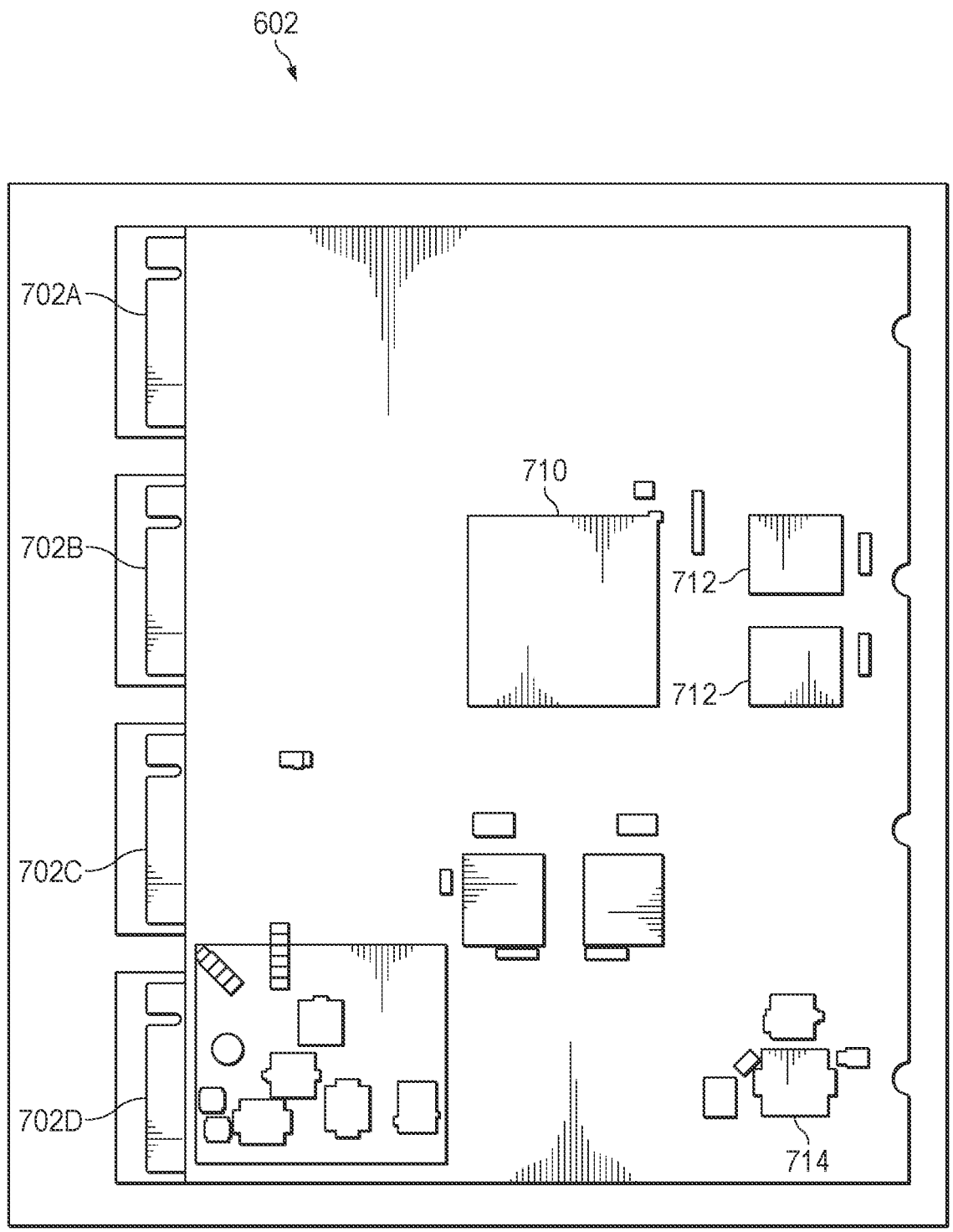
FIG. 7 illustrates a quad-slot dGPU module.

In another example, as illustrated in the example of FIG. 6, each of the M.2 connectors 220 (e.g., four M.2 connectors 220) are connected to a quad-slot dGPU module 602. Specifically, each of the M.2 connectors 220a, 220b, 220c, 220d are coupled to the quad-slot dGPU module 602. FIG. 7 illustrates an example quad-slot dGPU module 602. The quad-slot dGPU module 602 can include a first, a second, a third, and a fourth set of connections tabs 702a, 702b, 702c, 702d (collectively referred to as connection tabs 702) that can be inserted into respective M.2 connectors 220 to establish a coupling/connection with the M.2 connectors 220. The quad-slot dGPU module 602 can include an appropriate GPU chipset 710, memory modules 712, voltage regulator 714 (e.g., from 3.3 volts), and appropriate PCIe bus components from the connection tabs 702 (e.g., "gold fingers") to the GPU 710.

In another example, two of the M.2 connectors 220 are connected to a first dual-slot dGPU module (similar to the dual-slot dGPU module 212), and two other M.2 connectors are coupled to a second dual-slot dGPU module (similar to the dual-slot dGPU module 212). Specifically, the M.2 connectors 220a, 220b are both coupled to the first dual-slot dGPU module; and the M.2 connectors 220c, 220d are both coupled to second dual-slot dGPU module. The M.2 connectors 220a, 220b are adjacent to one another such that the first dual-slot dGPU module can be coupled to the M.2 connectors 220a, 220b; and the M.2 connectors 220c, 220d are adjacent to one another such that the second dual-slot dGPU module can be coupled to the M.2 connectors 220c, 220d. In some examples, the pitch between each of the M.2 connectors 220 is substantially the same (e.g., the distance between each adjacent M.2 connector 220 is substantially the same).

Figure 8:
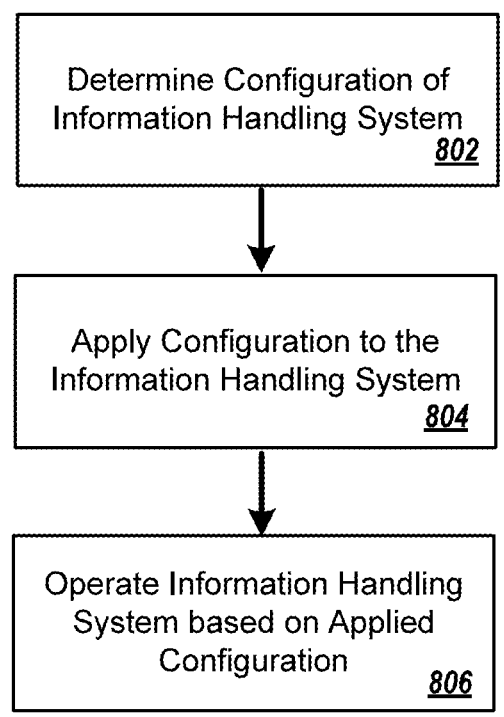
FIG. 8 illustrates a method for operating the information handling system.

FIG. 8 illustrates a flowchart depicting selected elements of an embodiment of a method 800 for changing states of the information handling system 201. The method 800 is with reference to FIGS. 1-7. It is noted that certain operations described in method 800 may be optional or may be rearranged in different embodiments.

A configuration of the information handling system 201 is determined (802). For example, the configuration can include an appropriate combination of M.2 modules and dGPU modules of the information handling system 201. Based on the determined configuration, the configuration is applied to the information handling system (804). For example, the configuration can include i) single-slot M.2 modules 210 are connected to each of the M.2 connectors 220; ii) two single-slot M.2 modules 210 are connected to two M.2 connectors 220 and one dual-slot dGPU module 212 is connected to adjacent M.2 connectors 220; iii) one quad-slot dGPU module is connected to four adjacent M.2 connectors 220; or iv) a first dual-slot dGPU module is connected to a first pair of adjacent M.2 connectors 220 and a second dual-slot dGPU module is connected to a second pair of adjacent M.2 connectors 220. The information handling system 200 is operated based on the applied configuration (806). For example, the information handling system 201 can be operated based on the applied configuration including i) single-slot M.2 modules 210 connected to each of the M.2 connectors 220; ii) two single-slot M.2 modules 210 connected to two M.2 connectors 220 and one dual-slot dGPU module 212 connected to adjacent M.2 connectors 220; iii) one quad-slot dGPU module connected to four adjacent M.2 connectors 220; or iv) a first dual-slot dGPU module connected to a first pair of adjacent M.2 connectors 220 and a second dual-slot dGPU module is connected to a second pair of adjacent M.2 connectors 220

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated other-wise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, features, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. An information handling system, comprising: two or more single-slot M.2 modules; a dual-slot discrete graphics processing unit (dGPU) module; a printed circuit board, including: a plurality of M.2 connectors aligned on an edge of the printed circuit board, wherein a pitch between each of the plurality of M.2 connectors is substantially the same such that the plurality of M.2 connectors support multiple configurations of the two or more single-slot M.2 modules and the dual-slot dGPU module, including: a first combination comprising: i) a first single-slot M.2 module of the two or more single-slot M.2 modules is coupled to a first M.2 connector of the plurality of M.2 connectors; ii) a second single-slot M.2 module of the two or more single-slot M.2 modules is coupled to a second M.2 connector of the plurality of M.2 connectors; and iii) the dual-slot dGPU module is coupled to a third and a fourth M.2 connector of the plurality of M.2 connectors, a second combination comprising: i) the first single-slot M.2 module of the two or more single-slot M.2 modules is coupled to the first M.2 connector of the plurality of M.2 connectors; ii) the second single-slot M.2 module of the two or more single-slot M.2 modules is coupled to the fourth M.2 connector of the plurality of M.2 connectors; and iii) the dual-slot dGPU module is coupled to the second and the third M.2 connector of the plurality of M.2 connectors; wherein the first, second, third, and fourth M.2 connectors are in order.

2. The information handling system of claim 1, wherein the third and the fourth M.2 connector of the plurality of M.2 connectors are adjacent to one another.

3. The information handling system of claim 1, wherein at least one of the single-slot M.2 modules include a solid-state storage (SSD) module.

4. An information handling system, comprising: two or more single-slot M.2 modules; a dual-slot discrete graphics processing unit (dGPU) module; a printed circuit board, including: a plurality of M.2 connectors aligned on an edge of the printed circuit board, wherein a pitch between each of the plurality of M.2 connectors is substantially the same such that the plurality of M.2 connectors support multiple combinations of coupling of i) the two or more single-slot M.2 modules and ii) the dual-slot dGPU module to the plurality of M.2 connectors, including: a first combination comprising: i) a first single-slot M.2 module of the two or more single-slot M.2 modules is coupled to a first M.2 connector of the plurality of M.2 connectors; ii) a second single-slot M.2 module of the two or more single-slot M.2 modules is coupled to a second M.2 connector of the plurality of M.2 connectors; iii) a third single-slot M.2 module of the two or more single-slot M.2 modules is coupled to a third M.2 connector of the plurality of M.2 connectors; iv) a fourth single-slot M.2 module of the two or more single-slot M.2 modules is coupled to a fourth M.2 connector of the plurality of M.2 connectors; a second combination comprising: i) the first single-slot M.2 module of the two or more single-slot M.2 modules is coupled to the first M.2 connector of the plurality of M.2 connectors; ii) the second single-slot M.2 module of the two or more single-slot M.2 modules is coupled to the second M.2 connector of the plurality of M.2 connectors; and iii) the dual-slot dGPU module is coupled to the third and the fourth M.2 connector of the plurality of M.2 connectors; wherein the first, second, third, and fourth M.2 connectors are in order.

5. The information handling system of claim 4, wherein at least one of the single-slot M.2 modules include a solid-state storage (SSD) module.

6. A printed circuit board, comprising: a plurality of M.2 connectors aligned on an edge of the printed circuit board wherein a pitch between each of the plurality of M.2 connectors is substantially the same such that the plurality of M.2 connectors support multiple configurations of single-slot M.2 modules and a dual-slot dGPU module, including: a first combination comprising: i) a first M.2 connector of the plurality of M.2 connectors is connected to a first single-slot M.2 module; ii) a second M.2 connector of the plurality of M.2 connectors is connected to a second single-slot M.2 module; and iii) a third and a fourth M.2 connector of the plurality of M.2 connectors is connected to a dual-slot dGPU module, a second combination comprising: i) the first M.2 connector of the plurality of M.2 connectors is connected to the first single-slot M.2 module; ii) the fourth M.2 connector of the plurality of M.2 connectors is connected to the second single-slot M.2 module; and iii) the second and the third M.2 connector of the plurality of M.2 connectors is connected to the dual-slot dGPU module; wherein the first, second, third, and fourth M.2 connectors are in order.

* * * * *